United States Patent [19]

Narikawa et al.

[11] Patent Number: 5,434,499
[45] Date of Patent: Jul. 18, 1995

[54] CONSTANT CURRENT SWITCHING CIRCUIT PROVIDED WITH A BASE CURRENT COMPENSATING CIRCUIT

[75] Inventors: Hiroshi Narikawa; Yoshiyuki Tamura, both of Kanagawa, Japan

[73] Assignee: NEC Corporation, Tokyo, Japan

[21] Appl. No.: 159,229

[22] Filed: Nov. 30, 1993

[30] Foreign Application Priority Data

Dec. 1, 1992 [JP] Japan ................................. 4-321741

[51] Int. Cl.⁶ .............................................. G05F 3/16
[52] U.S. Cl. ..................................... 323/315; 323/314
[58] Field of Search ............... 323/312, 313, 314, 315, 323/316, 317; 307/296.1, 296.6, 491; 330/288, 76, 78

[56] References Cited

U.S. PATENT DOCUMENTS

| | | | |
|---|---|---|---|
| 4,789,819 | 12/1988 | Nelson | 323/314 |
| 4,998,074 | 3/1991 | Van Lammeren et al. | 330/252 |
| 5,027,014 | 6/1991 | Bass et al. | 307/475 |
| 5,079,453 | 1/1992 | Tisinger et al. | 307/491 |
| 5,134,310 | 6/1992 | Mobley et al. | 307/270 |

FOREIGN PATENT DOCUMENTS

0458659 11/1991 European Pat. Off. .
2288416 10/1975 France .......................... H03F 3/347

OTHER PUBLICATIONS

Patent Abstracts of Japan, vol. 10, No. 145, 28 May 1986.
Patent Abstracts of Japan, vol. 6, No. 112, 23 Jun. 1982.
Patent Abstracts of Japan, vol. 10, No. 244, 22 Aug. 1986.

*Primary Examiner*—Steven L. Stephan
*Assistant Examiner*—Matthew V. Nguyen
*Attorney, Agent, or Firm*—Sughrue, Mion, Zinn, Macpeak & Seas

[57] ABSTRACT

A current switching circuit has a setting section, a switching section and a switch changeover section. The switching section has a current mirror circuit, n switching transistors, and a compensating circuit. The current mirror circuit has first through third transistors. Emitters of the first and second transistors are connected to a power supply terminal and bases thereof are connected with each other. The third transistor has an emitter connected to the bases of the first and second transistors, a collector grounded, and a base connected to a collector of the first transistor. The switching transistors have emitters connected to the collector of the second transistor, and collectors connected to one terminals of n load elements. The other terminals of the load elements are grounded. The switch changeover section controls the base currents of the switching transistors. The compensating circuit comprises two compensating transistors. The first compensating transistor has an emitter and a base connected to an emitter and a base of the second transistor, respectively. The first compensating transistor has a same size as that of the second transistor. The second compensating transistor has an emitter connected to a collector of the first compensating transistor, a collector grounded, and a base connected to the collector of the second transistor. The second compensating transistor has a same size as that of each of the n switching transistors.

14 Claims, 4 Drawing Sheets

CONSTANT CURRENT SWITCHING CIRCUIT PROVIDED WITH A BASE CURRENT COMPENSATING CIRCUIT

BACKGROUND OF THE INVENTION

1. Field of the Invention

The present invention relates to a current switching circuit, and more particularly to a constant current switching circuit provided with a base current compensating circuit.

2. Description of the Related Art

A current switching circuit selects any one of n load elements Z1 through Zn by a switch 21 and supplies a constant current from a current source 22 to the selected load element Zx (x=1 through n), as shown in FIG. 1, for example.

FIG. 2 shows a detailed arrangement of the current switching circuit shown in FIG. 1. This circuit comprises a current setting section 2, a current switching section 3, a switch changeover section 4, and so on. The current setting section 2 comprises an operational amplifier 41, a resistor R1, an NPN bipolar transistor Tr4, and a reference power supply 45 for generating a reference voltage Vref. The operational amplifier 41 has a non-inverted input terminal (+) connected to a positive electrode of the reference power supply 45, an inverted terminal (−) connected to an emitter of the transistor Tr4, and an output terminal connected to a base of the transistor Tr4. A negative electrode of the reference power supply 45 is grounded. The resistor R1 is connected between the emitter of the transistor Tr4 and the ground. A collector current I0 of the transistor Tr4 is arranged to be set to a constant value.

The current switching section 3 is arranged to include PNP bipolar transistors Tr1 through Tr3, and n PNP bipolar switch transistors TrSW1 through TrSWn each serving as a switch. Emitters of the transistors Tr1 and Tr2 are connected to a power supply terminal 1, and bases thereof are connected with each other. A collector of the transistor Tr1 is connected to a collector of the transistor Tr4 provided in the current setting section 2. The transistor Tr3 has a base connected to the collectors of the transistors Tr1 and Tr4, an emitter connected to bases of the transistors Tr1 and Tr2, and a collector grounded. A collector of the transistor Tr2 is connected to each emitter of the switch transistors TrSW1 through TrSwn. Collectors of the transistors TrSW1 through TrSWn are connected to one terminals of the load elements Z1 through Zn, respectively and bases of which receive outputs from the switch changeover section 4, respectively. The other terminals of the load elements Z1 through Zn are grounded.

In the above arrangement, when a base current IB1 flows into the transistor Tr3 due to the current I0 set by the current setting section 2, the transistor Tr3 is turned on. As a result, the transistors Tr1 and Tr2 constituting a current mirror circuit are turned on, resulting in a collector current I1 flowing into the transistor Tr2. The base currents of the switch transistors TrSW1 through TrSWn are controlled by the switch changeover section 4 such that a base current IB2x flows into the transistor TrSWx (x=1 through n) connected to the load element Zx into which the current is intended to flow. As a result, the transistor TrSWx is turned on and a current Izx flows into the selected load element Zx.

The collector current I1 of the transistor Tr2 and the current Izx flowing into the selected load element Zx are expressed by the following equations:

$$I1 = I0 - IB1 \qquad (1)$$

$$Izx = I1 - IB2x \qquad (2)$$

where, IB1 denotes a base current of the transistor Tr3, and IB2x denotes a base current of the transistor TrSWx.

If current amplification factors of the transistors Tr1 and Tr3 are assumed to be hFE1 and hFE3, respectively, the base current IB1 of the transistor Tr3 is expressed by equation (3).

$$IB1 = 2(I0 - IB1)/(hFE1 \times hFE3)$$
$$IB1 = 2I0/(hFE1 \times hFE3 + 2) \qquad (3)$$

Then, if the current amplification factor of the transistor TrSWx is assumed to be hFEx, the base current IB2x of the transistor TrSWx is expressed as $IB2x = Izx/hFEx$. Accordingly, $IB1 < <I0$ is obtained from the equation (3). As a result, IB1 is approximately 0. Accordingly, $I1 = I0$ is obtained from the equation (1). As a result, $Izx = I0\{1 - (1/hFEx)\}$ is obtained. Accordingly, the current Izx flowing into the load element Zx is changed in accordance with the current amplification factor hFEx of the switching transistor TrSWx.

As described above, according to a conventional current switch circuit, the current Izx flowing into the load element Zx is determined in accordance with $Izx = I0 \times \{1 - (1/hFEx)\}$. For this reason, there is a drawback that when the current amplification factor hFEx of the switching transistor TrSWx is small, 1/hFEx cannot be ignored, resulting in Izx<I0.

FIG. 3 shows a conventional current switching circuit which can compensate the influence by the base currents of the switching transistors TrSW1 through TrSWn upon the current flowing into the load element in the circuit shown in FIG. 2. In the circuit shown in FIG. 3, a base current compensating circuit 5 is provided in the current switching section 3'. The base current compensating circuit 5 comprises PNP bipolar transistors Tr5 through Tr7 and NPN bipolar transistors Tr8 and Tr9. The size of the transistor Tr5 is same as that of each switching transistor TrSW1 through TrSWn. An emitter of the transistor Tr5 is connected to the collector of the transistor Tr2, and a collector of which is connected to emitters of the transistors TrSW1 through TrSWn. Transistors Tr6 and Tr7 constitute a current mirror circuit. An emitter area of the transistor Tr6 is twice as that of the transistor Tr7. Emitters of the transistors Tr6 and Tr7 are connected to the power supply terminal 1, and the bases thereof are commonly connected. A collector of the transistor Tr6 is connected to a collector of the transistor Tr5. Transistors Tr8 and Tr9 constitute a current mirror circuit. The bases and the emitters of the transistors Tr8 and Tr9 are commonly connected, respectively. A collector of the transistor Tr8 is connected to the base of the transistor Tr5 as well as to the bases of the transistors Tr8 and Tr9. A collector of the transistor Tr9 is connected to the collector and the base of the transistor Tr7. There are provided m diodes D1, D2, ..., Dm anodes and cathodes of which are serially connected between the emitters of the transistors Tr8 and Tr9 and the ground. These diodes D1, D2, ..., Dm generate a reference voltage for setting the base bias voltage of the transistor Tr5.

The current switching circuit 3' shown in FIG. 3 has the following relations expressed by the equations (4) and (5) when the collector current of the transistor Tr2, the base current of the transistor Tr5, the base currents of the transistors Tr8 and Tr9, the base current of the transistor Tr6, the base current of the transistor Tr7, and the collector current of the transistor Tr6 are assumed to be I1, IB3, IB4, 2IB5, IB5, and I2, respectively.

$$Izx = I1 - IB3 + I2 - IB2x \quad (4)$$

$$I2 = (IB3 - 2IB4 - 3IB5) \times 2 \quad (5)$$

From the equations (4) and (5), the following equation is obtained.

$$Izx = I1 - IB2x + IB3 - 4IB4 - 6IB5$$

Since the size of each of the switching transistors TrSW1 through TrSWn is equal to the size of the transistor Tr5, IB2x=IB3 is obtained.

Further, IB4 is expressed as follows:

$$IB4 = [(I1 - IB3)/hFE5 - 2IB4]/hFE8$$

where hFE5 represents the current amplification factor of the transistor Tr5 and hFE8 represents the current amplification factor of the transistor Tr8. Thus, IB4 can be expressed as follows.

$$IB4 = (I1 - IB3)/[hFE5 \times (hFE8 + 2)]$$

The base current of the transistor Tr7 is expressed as follows.

$$IB5 = [\{(I1 - IB3)/hFE5 - 2IB4\} - 3IB5]/(hFE7)$$

As a result, the following relations are established.

$$IB5 = [\{(I1 - IB3)/hFE5\} - 2IB4]/(hFE7 + 3)$$

From IB4 << I1, IB4 ≈ 0
From IB5 << I1, IB5 ≈ 0

Accordingly, the following equation is obtained by substituting the equation (5) into the equation (4).

$$Izx = I1 - IB3 + 2(IB3 - 2IB4 - 3IB5) - IB2x = I1 - IB3 + 2IB3 - IB3 = I1$$

Accordingly, the circuit arrangement as shown in FIG. 3 permits the current Izx flowing into the selected load element Zx to be coincident with the collector current I1 of the transistor Tr2 and therefore is not influenced by the base currents of the switching transistors TrSW1 through TrSWn.

However, the circuit arrangement shown in FIG. 3 requires 5 bipolar transistors and m diodes to be added, resulting in increased number of elements. For this reason, when the current switching circuit is to be integrated, the pattern occupation area and the cost are increased.

SUMMARY OF THE INVENTION

An object of the present invention is to provide a current switching circuit which can compensating the influence by the base currents of the switching transistors upon the current flowing into the load element with reduced number of elements.

In order to achieve the above object, a current switching circuit of the present invention comprises: a current mirror circuit having first and second transistors; first through n-th switching transistors one terminals of current paths of which are connected to the second transistor and the other terminals of the current paths of which are connected to first through n-th (n is a positive integer) load elements, a selected one of the load elements being supplied with a current from the second transistor; a first compensating transistor one terminal of a current path of which and a control terminal of which are connected to one terminal of a current path and a control terminal of the second transistor, the size of the first compensating transistor being substantially equal to that of the second transistor; and a second compensating transistor one terminal of a current path of which is connected to the other terminal of the first compensating transistor, the other terminal of the current path of which is connected to a reference potential supply, a control terminal of which is connected to a node between the second transistor and the first through n-th switching transistors, and a size of which is substantially equal to that of each of the first through n-th switching transistors.

In the above arrangement, one terminals of current paths and control terminals of the first and second compensating transistors are commonly connected, respectively and the size of the first compensating transistor is same as that of the second compensating transistor. For this reason, the current flowing into the other terminal of the current path of the first compensating transistor is equal to the current flowing into the other terminal of the current path of the second compensating transistor. Furthermore, since the size of the second compensating transistor is substantially the same as that of each of the switching transistors, the reduction of the current flowing into the load element by the base currents of the switching transistor can be compensated by preliminarily adding the base current of the second compensating transistor to the current supplied to the switching transistors from the second transistor.

As described above, the influence upon the current flowing into the load element by the base currents of the switching transistors can be compensated by only adding the first and second compensating transistors. Accordingly, the same effect can be obtained with reduced number of element compared to a conventional current switching circuit provided with a base current compensating circuit.

DETAILED DESCRIPTION OF THE PREFERRED EMBODIMENT

Figure 4:
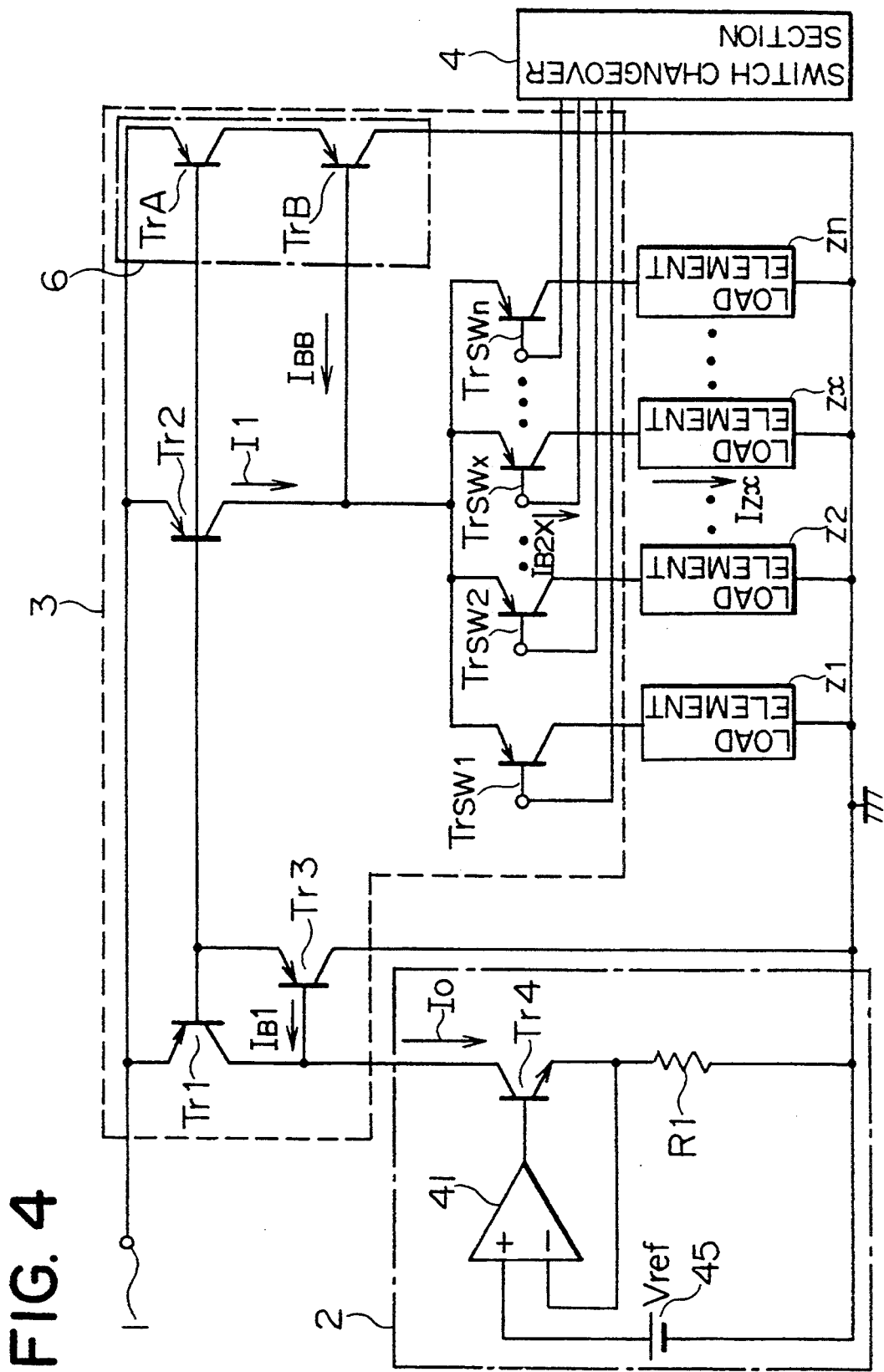
FIG. 4 is a circuit diagram showing a current switching circuit according to an embodiment of the present invention.

FIG. 4 shows a current switching circuit according to an embodiment of the present invention. This current switching circuit is arranged to include a current setting section 2, a current switching section 3, and a switch changeover section 4. A base current compensating circuit 6 is provided within the current switching section 3. The current setting section 2 is arranged to include an operational amplifier 41, a resistor R1, an NPN bipolar transistor Tr4, and a reference power supply 45 for generating a reference voltage Vref. An non-inverted input terminal (+) of the operational amplifier 41 is connected to a positive electrode of the reference power supply 45, the inverted input terminal (−) of which is connected to an emitter of the transistor Tr4, and an output terminal of which is connected to a base of the transistor Tr4. The negative electrode of the reference power supply 45 is grounded. The resistor R1 is connected between the emitter of the transistor Tr4 and the ground. A collector current I0 of the transistor Tr4 is arranged to be set to a constant value.

The current switching section 3 is arranged to include PNP bipolar transistors Tr1 through Tr3, n PNP bipolar transistors TrSW1 through TrSWn each serving as a switch, and PNP bipolar transistors TrA and TrB. The transistors TrA and TrB serve as a base current compensating circuit 6. The emitters of the transistors Tr1, Tr2, and TrA are each connected to the power supply terminal 1, and the bases thereof are commonly connected. A collector of the transistor Tr1 is connected to a collector of the transistor Tr4 provided within the current setting section 2. The transistor Tr3 has a base connected to the collectors of the transistors Tr1 and Tr4, an emitter connected to the bases of the transistors Tr1, Tr2, and TrA, and a collector grounded. A collector of the transistor Tr2 is connected to each of the emitters of the switching transistors TrSW1 through TrSWn. The collectors of the transistors TrSW1 through TrSWn are connected to one terminals of the load elements Z1 through Zn, respectively and the bases thereof receive the outputs from the switching changeover section 4, respectively. The other terminals of the load elements Z1 through Zn are grounded.

A size of the transistor TrA is same as that of the transistor Tr2. A size of the transistor TrB is same as that of each of the switching transistors TrSW1 through TrSW2. A collector of the transistor TrA is connected to an emitter of the transistor TrB. A base of the transistor TrB is connected to the collector of the transistor Tr2. A collector of the transistor TrB is grounded.

An operation of the current switching circuit having the above arrangement will now be described. When a base current IB1 flows into the transistor Tr3 by the current I0 set by the current setting section 2, the transistor Tr3 is turned on. As a result, the transistors Tr1, Tr2, and TrA constituting a current mirror circuit are turned on, and a collector current I1 flows into the transistors Tr2 and TrA. The switch changeover circuit 4 controls the base currents of the switching transistors TrSW1 through TrSWn such that a base current flows into the transistor TrSWx (x=1 through n) connected to the load element Zx into which a current is intended to flow. As a result, the transistor TrSWx is turned on and a current Izx flows into the selected load element Zx.

The current I0 set by the current setting section 2 and the current I1 flowing into the collectors of the transistors Tr2 and TrA can be assumed to have a relation of I0=I1.

A current Izx flowing into the selected load element Zx is expressed as follows when a current flowing into a base of the transistor TrSWx and a current flowing into a base of the transistor TrB are assumed to be IB2x and IBB, respectively.

$Izx = I1 + IBB - IB2x$

The base current IBB is expressed as follows when a current amplification factor of the transistor TrB is assumed to be hFEB.

$IBB = (I1 - IBB)/hFEB$

Accordingly, the IBB can be represented as follows.

$IBB = I1/(hFEB+1)$

The base current IB2x is expressed as follows when the current amplification factor of the transistor TrSWx is assumed to be hFEx.

$IB2x = Izx/hFEx$

Further, since the size of the transistor TrSWx is equal to that of the transistor TrB, hFEx=hFEB is obtained. Accordingly, the following equation is obtained.

$Izx = I1 \times hFEx(hFEx+2)/(hFESWx+1)^2 = I1 \times (1+2/hFEx)/[(1+2/hFEx+(1/hFEx)^2]$ Since $(1/hFEX)^2 \doteqdot 0$ can be assumed, Izx=I1 is obtained.

Figure 1:
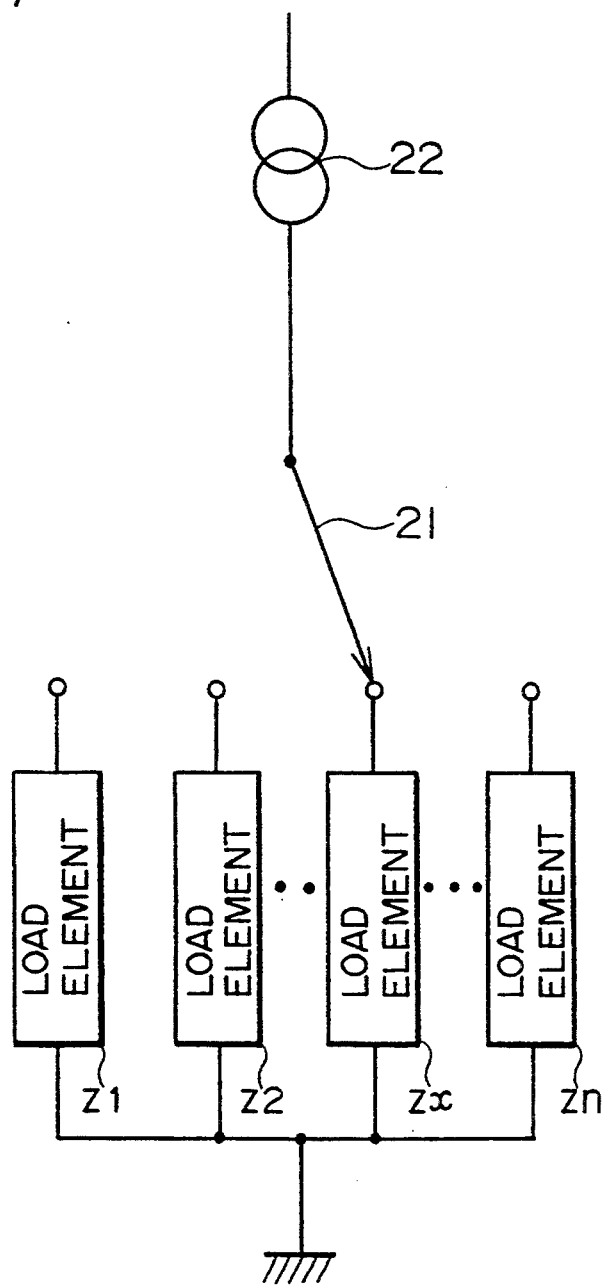
FIG. 1 is a circuit diagram showing a schematic arrangement for explaining a principle of a conventional current switching circuit.
Figure 2:
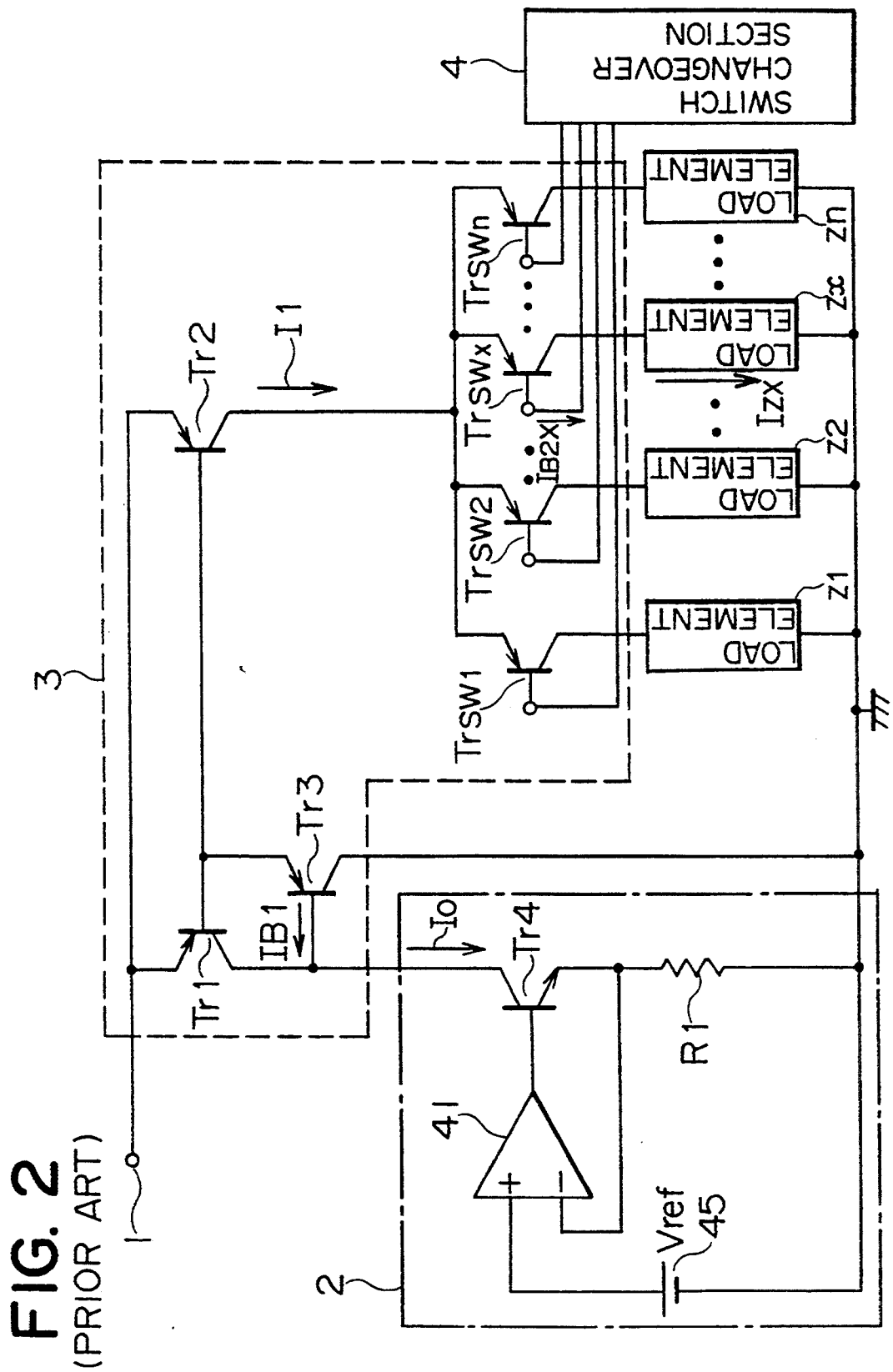
FIG. 2 is a circuit diagram showing a detailed arrangement of the current switching circuit shown in FIG. 1.
Figure 3:
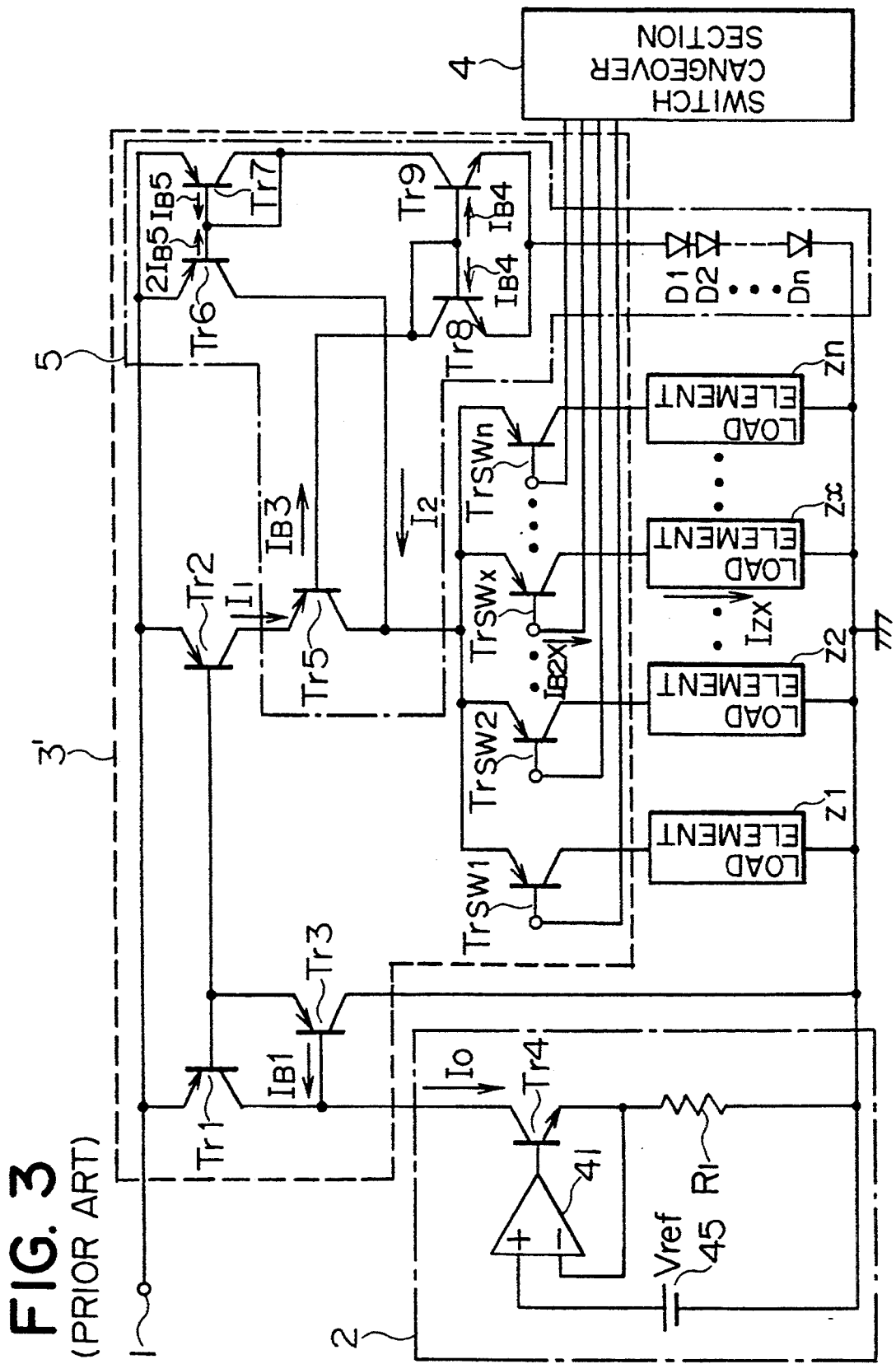
FIG. 3 is a circuit diagram showing a conventional current switching circuit provided with a base current compensating circuit.

According to the arrangement shown in FIG. 4, the influence upon the current flowing into the selected load element by the base currents of the switching transistors can be compensated by only adding the transistors TrA and TrB. Accordingly, the number of elements can be reduced drastically compared to a conventional circuit shown in FIG. 3. Therefore, the pattern occupied area and the cost can be reduced when the circuit is to be integrated. In the above embodiment, the current switching section 3 is constituted by PNP type bipolar transistors but the same effect can be obtained by using NPN type bipolar transistors. An example has been described in which one of a plurality of load elements is selected. However, the present invention can be applied to a case in which a single load element and a single switching transistor are provided. Even in this case, the influence upon the current flowing into the load element by the base current of the switching transistor can be compensated.

What is claimed is:
1. A current switching circuit comprising:
    a current mirror circuit having first and second transistors;
    first through n-th (n is a positive integer) load elements;
    first through n-th switching transistors each having a first current path terminal connected to the second transistor and a second current path terminal connected to one of the first through n-th load elements, wherein a selected one of the load elements is supplied with a current from the second transistor;

a first compensating transistor having a first current path terminal and a control terminal connected to a first current path terminal and a control terminal of the second transistor, respectively, wherein a size of the first compensating transistor is substantially equal to that of the second transistor; and a second compensating transistor having a first current path terminal connected to a second current path terminal of the first compensating transistor, a second current path terminal connected to a reference potential supply, and a control terminal connected to a node between the second transistor and the first through n-th switching transistors, wherein a size of the second compensating transistor is substantially equal to that of each of the first through n-th switching transistors.

2. The current switching circuit according to claim 1, wherein polarities of each of the first and second compensating transistors are equal to those of the second transistor.

3. The current switching circuit according to claim 1, wherein polarities of each of the first and second transistors, polarities of each of the first and second compensating transistors, and polarities of each of the first through n-th switching transistors are identical with each other.

4. The current switching circuit according to claim 1, further comprising current setting means for setting a current to be input into the first transistor.

5. The current switching circuit according to claim 4, wherein the current setting means comprises:

a third transistor having a first current path terminal connected to the first transistor;

a reference power supply for generating a reference voltage;

an operational amplifier having a non-inverted input terminal connected to the reference power supply, an inverted input terminal connected to a second current path terminal of the third transistor, and an output terminal connected to a control terminal of the third transistor; and a load element connected between the second current path terminal of the third transistor and the reference potential supply.

6. The current switching circuit according to claim 1, further comprising a fourth transistor having a first current path terminal connected to both a control terminal of the first transistor and the control terminal of the second transistor, a second current path terminal connected to the reference potential supply, and a control terminal connected to a first current path terminal of the first transistor.

7. The current switching circuit according to claim 1, further comprising switch changeover means for controlling ON and OFF switching of the first through n-th switching transistors.

8. The current switching circuit according to claim 1, wherein the second current path terminals of the first through n-th load elements are each connected to the reference potential supply.

9. The current switching circuit according to claim 1, wherein the reference potential supply generates a ground level voltage.

10. A current switching circuit, comprising:

first and second transistors having emitters connected to a first potential supply means and bases which are commonly connected;

a third transistor having an emitter connected to the bases of the first and second transistors, a collector connected to a second potential supply means, and a base connected to a collector of the first transistor;

current setting means for setting a collector current of the first transistor;

first through n-th (n is a positive integer) load elements;

first through n-th switching transistors each having an emitter connected to a collector of the second transistor and a collector respectively connected to one terminal of each of the first through n-th load elements;

switch changeover means for controlling ON and OFF switching of the first through n-th switching transistors by controlling base currents thereof;

a first compensating transistor having an emitter and a base commonly connected to the emitter and the base of the second transistor, respectively, wherein a size of the first compensating transistor is substantially equal to that of the second transistor; and a second compensating transistor having an emitter connected to a collector of the first compensating transistor, a collector connected to the second potential supply means, and a base connected to the collector of the second transistor, wherein a size of the second compensating transistor is substantially equal to that of each of the first through n-th switching transistors.

11. The current switching circuit according to claim 10, wherein polarities of the first and second compensating transistors are equal to polarities of the second transistor.

12. The current switching circuit according to claim 10, wherein polarities of the first through third transistors, polarities of the first and second compensating transistors, and polarities of the first through n-th switching transistors are identical with each other.

13. The current switching circuit according to claim 10, wherein the current setting means comprises:

a fourth transistor having a collector connected to the collector of the first transistor;

a reference power supply for generating a reference voltage;

an operational amplifier having a non-inverted input terminal connected to the reference power supply, an inverted input terminal connected to an emitter of the fourth transistor, and an output terminal connected to a base of the fourth transistor; and a load element connected between an emitter of the fourth transistor and the second potential supply means.

14. The current switching circuit according to claim 10, wherein other terminals of each of the first through n-th load elements are connected to the second potential supply means.

* * * * *

UNITED STATES PATENT AND TRADEMARK OFFICE
CERTIFICATE OF CORRECTION

PATENT NO.   : 5,434,499
DATED        : July 18, 1995
INVENTOR(S)  : Hiroshi NARIKAWA et al.

It is certified that error(s) appears in the above-identified patent and that said Letters Patent is hereby corrected as shown below:

Col. 3, line 44, delete "$\doteq$" and insert --$\fallingdotseq$--.

Col. 3, line 45, delete "$\doteq$" and insert --$\fallingdotseq$--.

Col. 6, line 36, delete "$\doteq$" and insert --$\fallingdotseq$--.

Signed and Sealed this

Sixteenth Day of January, 1996

Attest:

BRUCE LEHMAN

*Attesting Officer*    Commissioner of Patents and Trademarks